(12) United States Patent
Bitton

(10) Patent No.: US 6,519,541 B1
(45) Date of Patent: Feb. 11, 2003

(54) MULTIPLE FREQUENCY SIGNAL DETECTOR

(75) Inventor: Charly Bitton, Bet Dagan (IL)

(73) Assignee: Vocaltec Communication, Ltd., Herzliya (IL)

( * ) Notice: Subject to any disclaimer, the term of this patent is extended or adjusted under 35 U.S.C. 154(b) by 0 days.

(21) Appl. No.: 09/324,159

(22) Filed: Jun. 2, 1999

(51) Int. Cl.[7] ............................................. G01R 23/16
(52) U.S. Cl. ........................ 702/76; 708/405; 379/386
(58) Field of Search .......................... 702/75, 76, 190, 702/233; 379/386, 346, 390.02, 387; 708/405

(56) References Cited

U.S. PATENT DOCUMENTS

| | | | | |
|---|---|---|---|---|
| 4,066,881 A | * | 1/1978 | Houdard | ..................... 708/405 |
| 5,353,346 A | | 10/1994 | Cox et al. | |
| 5,694,466 A | * | 12/1997 | Xie et al. | .................... 379/386 |
| 5,809,133 A | * | 9/1998 | Bartkowiak et al. | ........ 379/386 |

OTHER PUBLICATIONS

G. Arslan et al., "Performance Evaluation and Real–Time Implementation of Subspace, Adaptive, and DFT Algorithms for Multi–Tone Detection," Proc. IEEE Int. Conf. on Telecommunications, Istanbul, Turkey, Apr. 1996, vol. II, pp. 884–887.

* cited by examiner

*Primary Examiner*—Marc S. Hoff
*Assistant Examiner*—Mohamed Charioui
(74) *Attorney, Agent, or Firm*—Katten Muchin Zavis Rosenman

(57) ABSTRACT

A method for characterizing a dual frequency (DF) signal including the steps of sampling the signal at a sampling frequency $v_s$ so as to obtain a sequence of signal samples, and obtaining an $\alpha$-constant and a $\beta$-constant of the DF signal meeting a predetermined criterion.

18 Claims, 2 Drawing Sheets

MULTIPLE FREQUENCY SIGNAL DETECTOR

FIELD OF THE INVENTION

The present invention relates to a detector and a classifier for signals that are the additive combination of a few constant-amplitude sinusoidal components.

BACKGROUND OF THE INVENTION

A multiple frequency (MF) signal is the additive combination of a few constant-amplitude sinusoidal components. Such signals are used in a variety of signaling processes. Dual frequency (DF) signals, also known as dual-tone multiple frequencies (DTMF), are signals that are an additive combination of two equal-amplitude sinusoidal components. Thus, the signal generated by depressing "1" on the telephone keypad is the sum of a 697 Hz and a 1209 Hz sine wave, and the signal generated by depressing "5" is the sum of a 770 Hz and a 1336 Hz sine wave. DF signals are used for example, for representing telephone numbers and other signaling functions within a telephone system including interactive voice response.

The use of IF signals in signaling processes makes it is necessary to quickly detect and accurately classify such signals, even in a low signal to noise ratio environment, without falsely detecting MF signals within other valid signals. This poses a challenge because short segments of speech occasionally resemble MF signals.

U.S. Pat. No. 5,353,346 to Cox et al. discloses a method for detecting and classifying MF signals. Their method includes filtering the signal to isolate each of the spectral components in the signal, and then determining the frequency of each isolated component. Their method, however, is only applicable when all, of the component frequencies in the MF signal are a priori known to be members in a relatively small set of predetermined frequencies. This would be the case in telephone signaling where each DF signal is composed of two frequencies taken from two predetermined non-overlapping sets of frequencies.

Methods are known in the art for MF signal detection in the absence of a priori knowledge of the frequencies in the signal. A review of such methods may be found in Arslan et at. Proc. IEEE. Vol. II, 1996, pages 884–887. These methods, however, are computationally complex and require relatively long signals.

There is therefore a need in the art for a method of detection and classification of MF signals in the absence of a priori knowledge of the frequencies which is computationally efficient.

SUMMARY OF THE INVENTION

In its first aspect, the present invention provides a method for characterizing a DF signal. The characterization of a DF signal, in accordance with the invention, allows rapid and accurate detection of the frequencies of the signal without processing the signal. The methods of the invention may be used in any environment using DTMF signals, such as telephone signaling including interactive voice response.

A digital sine wave of frequency v obtained from an analogue signal by sampling at a sampling frequency $v_s$ can be represented by $$H_v(z) = 1 - 2\cos\left(\frac{2\pi v_1}{v_s}\right)z^{-1} + z^{-2} \tag{1}$$

where z is a complex variable. A DF signal comprising two sine waves of frequencies $v_1$ and $v_2$ can thus be represented by $$H(z) = H_{v_1}(z) \cdot H_{v_2}(Z) = 1 - \alpha z^{-1} - \beta z^{-2} - \alpha z^{-3} + z^{-4} \tag{2}$$

wherein $\alpha$ and $\beta$ are the real valued parameters $$\alpha = 2\left\{\cos\left(\frac{2\pi v_1}{v_s}\right) + \cos\left(\frac{2\pi v_2}{v_s}\right)\right\} \tag{3}$$

$$\beta = -2 - 4\cos\left(\frac{2\pi v_1}{v_s}\right)\cos\left(\frac{2\pi v_2}{v_s}\right)$$

A DF signal is uniquely determined by the pair of constants $\alpha$ and $\beta$ defined by (3). Thus in accordance with the invention, a DF signal is characterized by this pair of constants. The two constants $\alpha$ and $\beta$ defined by (3) characterizing a DF signal are referred to herein as the $\alpha$-constant and the $\beta$-constant of the DF signal. As described in detail herein below, the $\alpha$-constant and the $\beta$-constant may be used to determine the two spectral frequencies of the DF signal.

In a preferred embodiment, the $\alpha$-constant and the $\beta$-constant of a DF signal are obtained as follows. A digital DF signal obtained by sampling an analog signal at a sampling frequency $v_s$ can be represented by the finite sequence of sampled values $\{x(n)\}$. It follows from (2) that the sequence $\{x(n)\}$ satisfies the following sequence of fifth order difference equations:

$$(x(n)+x(n+2))\alpha + \beta x(n+1) = x(n+3) + x(n-1) \tag{4}$$

Thus, in accordance with the invention, the $\alpha$-constant and the $\beta$-constant of the DF signal are obtained as solutions to the finite sequence of equations (4) that meet a predetermined quality criterion. As will be described herein below, by a specific embodiment of the invention, the predetermined quality criterion consists of minimizing an error function.

In its second aspect, the invention provides a method for determining the two spectral frequencies of a DF signal. Unlike the prior art, in accordance with this aspect of the invention, it is not necessary to first separate the signal into its two spectral components. Moreover, the method is computationally efficient and may be applied when the two spectral components are not presumed to be members of a predetermined set of frequencies.

In accordance with this aspect of the invention, the frequencies $v_1$ and $v_2$ of a DF signal are obtained from the $\alpha$-constant and the $\beta$-constant of the signal using algorithmic expressions expressing the frequencies $v_1$ and $v_2$ as functions of the $\alpha$-constant and the $\beta$-constant. In a preferred embodiment, such algorithmic expressions are obtained as follows. Equations (3) may be rewritten in the form:

$$\frac{\alpha}{2} = \left\{\cos\left(\frac{2\pi v_1}{v_s}\right) + \cos\left(\frac{2\pi v_2}{v_s}\right)\right\} - \frac{\beta+2}{4} = \cos\left(\frac{2\pi v_1}{v_s}\right)\cos\left(\frac{2\pi v_2}{v_s}\right)$$

It follows from (5) that $$\cos\left(\frac{2\pi v_1}{v_s}\right)$$

and $$\cos\left(\frac{2\pi v_2}{v_s}\right)$$

are solutions of the quadratic equation $$\lambda^2 - \frac{\alpha}{2}\lambda - \frac{\beta+2}{4} = 0. \tag{6}$$

The solutions $\lambda_1$ and $\lambda_2$ of (6) are $$\lambda_1 = \frac{\alpha + \sqrt{\alpha^2 + 4(\beta+2)}}{4} \tag{7}$$

$$\lambda_2 = \frac{\alpha - \sqrt{\alpha^2 + 4(\beta+2)}}{4}$$

Hence, $$v_1 = \frac{v_s}{2\pi}\cos^{-1}\lambda_1 \tag{8}$$

$$v_2 = \frac{v_s}{2\pi}\cos^{-1}\lambda_2$$

Substitution of equations (7) into (8) yields algorithmic expressions for the frequencies $v_1$ and $v_2$ of the signal as functions of the $\alpha$-constant and the $\beta$-constant of the DF signal.

The invention thus provides a method for characterizing a dual frequency (DF) signal comprising the steps of:
  (a) sampling the signal at a sampling frequency $v_s$ so as to obtain a sequence of signal samples; and
  (b) obtaining an $\alpha$-constant and a $\beta$-constant of the DF signal meeting a predetermined criterion.

The invention also provides a method for determining the two spectral components $v_1$ and $v_2$ of a DF signal comprising the steps off:
  (a) sampling the signal at a sampling frequency $v_s$ so as to obtain a sequence of signal samples;
  (b) obtaining an $\alpha$-constant and a $\beta$-constant of the DF signal;
  (c) obtaining $v_1$ and $v_2$ from the $\alpha$-constant and the $\beta$-constant of the DF signal using algorithric expressions expressing $v_1$ and $v_2$ as functions of the $\alpha$-constant and the $\beta$-constant.

The invention still further provides a device for characterizing a dual frequency (DF) signal comprising:
  (a) An analog to digital converter sampling the signal at a sampling frequency $v_s$ so as to obtain a sequence of signal samples; and
  (b) a computer processing unit processing the sequence of sample signals so as to produce an $\alpha$-constant and a $\beta$-constant of the DF signal meeting a predetermined criterion.

The invention also provides a device for determining the two spectral components $v_1$ and $v_2$ of a DF signal comprising:
  (a) An analog to digital converter sampling the signal at a sampling frequency $v_s$ so as to obtain a sequence of signal samples;
  (b) A computer processing unit processing the sequence of signal samples so as to produce an $\alpha$-constant and a $\beta$-constant of the DF signal; the computer processing unit further processing the $\alpha$-constant and the $\beta$-constant so as to calculate $v_1$ and $v_2$ from the $\alpha$-constant and the $\beta$-constant using algorithmic expressions expressing $v_1$ and $v_2$ as functions of the $\alpha$-constant and the $\beta$-constant.

BRIEF DESCRIPTION OF THE DRAWINGS

The novel features believed characteristic of the invention are set forth in the appended claims. The invention itself, however, as well as other features and advantages thereof, will be best understood by reference to the description which follows, read in conjunction with the accompanying drawings wherein:

DETAILED DESCRIPTION OF A PREFERRED EMBODIMENT

Figure 1:
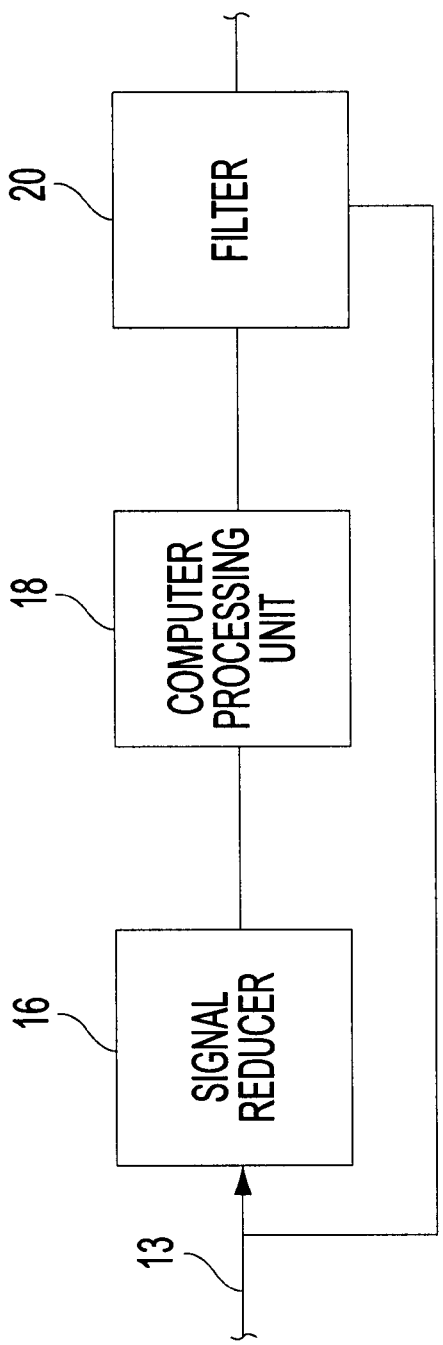
FIG. 1 is a DF signal detector and classifier in accordance with one embodiment of the invention.

Referring to FIG. 1, there is shown a block diagram of a DF signal detector and classifier according to a preferred embodiment of the invention. The input data stream 13 representing the DF is in digital form, being a finite sequence of samples $\{x(n)\}$ of an analog signal taken at a sampling frequency $v_s$. In a most preferred embodiment, $v_s$ is at least twice the frequency of the highest frequency component present in the DF signal.

The data stream 13 is optionally inputted to a signal reducer 16 comprising a low pass filter. The resulting data stream is then inputted to a computer processing unit 18 for determining the $\alpha$-constant and the $\beta$-constant of the DF signal.

Various criteria may be used for selecting $\alpha$ and $\beta$ that are optimal solutions to the sequence of equations (4). In a preferred embodiment, the $\alpha$-constant and the $\beta$-constant of the DF signal are obtained by a least squares optimization process. Sequences $a_n$, $b_n$, and $c_n$ are define by $$a_n = x(n) + x(n+2)$$

$$b_n = x(n+1)$$

$$c_n = x(n+3) + x(n-1) \tag{9}$$

Substituting equations (9) into (4) yields $$\alpha a_n + \beta b_n = c_n \tag{10}$$

An error function, err (r,s), is defined by $$\text{err}(r,s) = \Sigma(ra_n + sb_n - c_n)^2 \tag{11}$$

where the sum is taken over all n in the sample for which $c_n$ is defied.

In the preferred embodiment, the $\alpha$-constant and the $\beta$-constant of the DF signal are the values of r and s, respectively, for which err(r,s) is minimal.

The $\alpha$-constant and the $\beta$-constant are thus found by setting the partial derivatives of err to 0 and substituting $\alpha$ and $\beta$ for r and s, respectively, to yield:

$$\Sigma a_n(\alpha a_n + \beta b_n - c_n) = 0$$

$$\Sigma b_n(\alpha a_n + \beta b_n - c_n) = 0 \tag{12}$$

Equations (12) can be rearranged to yield $$\alpha \Sigma a_n^2 + \beta \Sigma a_n b_n = \Sigma a_n c_n$$

$$\alpha \Sigma a_n b_n + \beta \Sigma b_n^2 = \Sigma b_n c_n \tag{13}$$

The solution to the pair of linear equations (13) is $$\alpha = \frac{(\sum a_n c_n)(\sum b_n^2) - (\sum b_n c_n)(\sum a_n b_n)}{(\sum a_n^2)(\sum b_n^2) - (\sum a_n b_n)^2} \quad (14)$$

$$\beta = \frac{(\sum b_n c_n)(\sum a_n^2) - (\sum a_n c_n)(\sum a_n b_n)}{(\sum a_n^2)(\sum b_n^2) - (\sum a_n b_n)^2}$$

The two spectral frequencies of the DF signal $v_1$ and $v_2$ may then be obtained from the α-constant and the β-constant using equations (8).

In cases of a low signal to noise environment, the values of $v_1$ and $v_2$ obtained as described above may be further refined. Thus, for example, the signal 13 is inputted to filter 20, where it is filtered through the filter $W(z)=H(zy_1)/H(zy_2)$. The filtered DF signal is inputted to a CPU which determines the α-constant and the β-constant of the filtered DF signal. These α-constant and the β-constant are then used to obtain refined values of $v_1$ and $v_2$ using equations (8). This iterative processes for refining the obtained α and β constants may be repeated as many times as necessary. In practice no more than two or three iterations are necessary.

Figure 2:
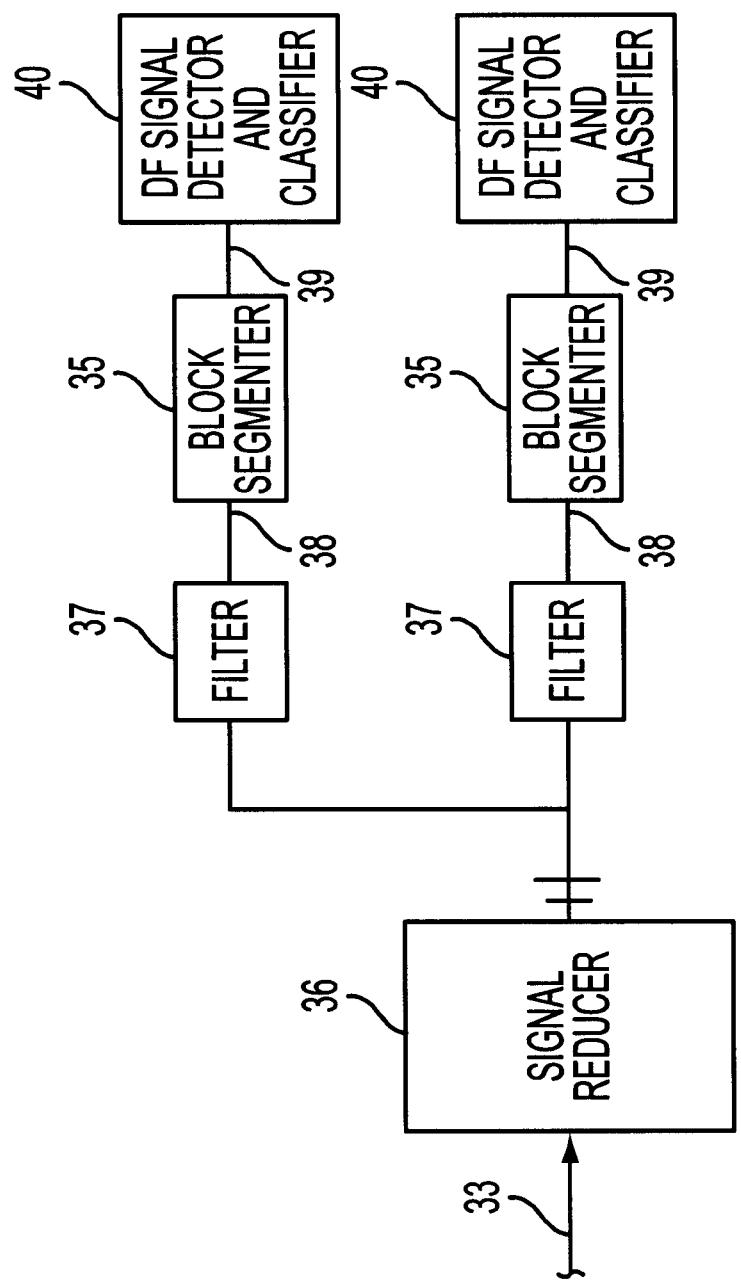
FIG. 2 is an MF signal detector and classifier in accordance with one embodiment of the invention.

The invention may be used for detecting and classifying an MF signal possibly having more than two spectral frequencies. Component isolation filters, known per se, are used to isolate one or two frequencies from the signal. As shown in FIG. 2, the input data stream 33 representing the MF signal is in digital form, being a finite sequence {x(n)} of samples of an analog signal taken at a sampling frequency $v_s$. In a most preferred embodiment, $v_s$ is at least twice the frequency of the highest frequency component present in the MF signal. The data stream 33 is optionally inputted to a signal reducer 36 comprising a low pass filter.

The output data stream is inputted to two or more component isolation filters. Two component isolation filters 37 are shown in FIG. 2, although any number may be used. The component isolation filters serve to remove extraneous signal components and to separate the input stream of data into parallel output streams 38. Each output stream contains up to two spectral components of the input stream 33. The component isolation filtering is preferably performed such that each output stream contains at least one spectral component of the MF signal, none of the spectral components of the MF signal appear on more than one output stream; and none of the spectral components of the MF signal fail to appear on any of the output streams.

The signal is then directed to the block segmenters 35 to obtain parallel blocks of successive data samples 39, by methods known per se. Preferably, all blocks contain the same number of samples and that the segmentation boundaries for each stream are aligned in time. Subsequent processing is then performed on time-aligned sets of blocks that contain one block from each stream. Each output stream being a DF signal. is processed by a DF signal detector and classifier 40 in accordance with the invention, for example as shown in FIG. 1

The invention has been described with a certain degree of peculiarity. The inventions however, should be considered as being bound only by the following claims.

What is claimed is:

1. A method for characterizing a dual frequency (DF) signal comprising the steps of:
   (a) sampling the signal at a sampling frequency $v_s$ so as to obtain a sequence of signal samples; and
   (b) obtaining an α-constant and a β-constant of the DF signal which minimizes an error function utilizing said sequence of signal samples.

2. The method of claim 1 wherein the error function utilized to obtain the α-constant and the β-constant is a least squares method.

3. The method of claim 2 wherein the α-constant and the β-constant minimize the error function err(r,s) defined by:

$$err(r,s) = \Sigma(ra_n + sb_n - c_n)^2$$

wherein $$a_n = x(n) + x(n+2),$$

$$b_n = x(n+1),$$

and $$c_n = x(n+3) + x(n-1);$$

and x(n) is the sequence of signal samples.

4. The method of claim 3 for use in obtaining an α-constant and a β-constant of a DTMF.

5. A method according to claim 1 for characterizing a DF signal comprising tile steps of:
   (a) sampling the signal at a sampling frequency $v_s$ so as to obtain a sequence of signal samples;
   (b) fitering the sequence of samples; and
   (c) obtaining an α-constant and a β-constant of the DF signal which minimizes an error function utilizing said sequence of signal samples.

6. The method of claim 1 for use in characterizing a dual tone multi frequency (DTMF) signal.

7. The method according to claim 1 wherein the signal is part of a telephone signal.

8. A method for determining the two spectral components $v_1$ and $v_2$ of a DF signal comprising the steps of:
   (a) sampling the signal at a sampling frequency $v_s$ so as to obtain a sequence of signal samples;
   (b) obtaining an α-constant and a β-constant of the DF signal which minimizes an error function utilizing said sequence of signal samples;
   (c) obtaining $v_1$ and $V_2$ from the α-constant and the β-constant of the DF signal using algorithmic expressions expressing $v_1$ and $v_2$ as functions of the α-constant and the β-constant.

9. A method according to claim 8 for determining the two spectral components $v_1$ and $v_2$ of a DF signal comprising the steps of:
   (a) sampling the signal at a sampling frequency $v_s$ so as to obtain a sequence of signal samples;
   (c) obtaining the α-constant and the β-constant of the DF signal which minimizes an error function utilizing said sequence of signal samples;
   (c) obtaining $v_1$ and $V_2$ according to the algorithmic expressions:

$$v_1 = \frac{v_s}{2\pi} \cos^{-1} \lambda_1$$

$$v_2 = \frac{v_s}{2\pi} \cos^{-1} \lambda_2$$

wherein $$\lambda_1 = \frac{\alpha + \sqrt{\alpha^2 + 4(\beta+2)}}{4} \quad \text{and}$$

$$\lambda_2 = \frac{\alpha - \sqrt{\alpha^2 + 4(\beta+2)}}{4},$$

wherein α and β are the α-constant and the β-constant, respectively.

10. The method according to claim 8 for use in determining the two spectral components of a DTMF signal.

11. The method according to claim 8 for determining the two spectral components $v_1$ and $v_2$ of a DF signal comprising the steps of:
  (a) sampling the signal at a sampling frequency $v_s$ so as to obtain a sequence of signal samples;
  (b) obtaining an α-constant and a β-constant of the DF signal which minimizes an error function utilizing said sequence of signal samples;
  (c) obtaining $v_1$ and $v_2$ according to the algorithmic expressions:

$$v_1 = \frac{v_s}{2\pi}\cos^{-1}\lambda_1$$

$$v_2 = \frac{v_s}{2\pi}\cos^{-1}\lambda_2$$

wherein $$\lambda_1 = \frac{\alpha + \sqrt{\alpha^2 + 4(\beta+2)}}{4} \quad \text{and}$$

$$\lambda_2 = \frac{\alpha - \sqrt{\alpha^2 + 4(\beta+2)}}{4},$$

wherein α is the α-constant and β is the β-constant;
  (d) filtering the DF signal through the filter $W(z)=H(z\gamma_1)/H(z\gamma_2)$ so as to obtain a filtered DF signal,
  (e) obtaining the α-constant and the β-constant of the filtered DF signal which minimizes an error function,
  (f) obtaining $v_1$ and $v_2$ according to the algorithmic expressions:

$$v_1 = \frac{v_s}{2\pi}\cos^{-1}\lambda_1$$

$$v_2 = \frac{v_s}{2\pi}\cos^{-1}\lambda_2$$

wherein $$\lambda_1 = \frac{\alpha + \sqrt{\alpha^2 + 4(\beta+2)}}{4} \quad \text{and}$$

$$\lambda_2 = \frac{\alpha - \sqrt{\alpha^2 + 4(\beta+2)}}{4},$$

wherein α and β are the α-constant and the β-constant of the filtered DF signal;
  (g) repeating steps d to f as many times as desired.

12. A device for characterizing a dual frequency (DF) signal comprising:
  (a) an analog to digital converter sampling the signal at a sampling frequency $v_s$ so as to obtain a sequence of signal samples; and
  (b) a computer processing unit processing the sequence of sample signals so as to produce an α-constant a β-constant of the DF signal which minimizes an error function utilizing said sequence of signal samples.

13. The device of claim 12 wherein the error function utilized to obtain the α-constant and the β-constant is a least squares method.

14. The device of claim 13 wherein the α-constant and the β-constant minimize the error function err(r,s) defined by:

$$err(r,s) = \Sigma(ra_n + sb_n - c_n)^2$$

wherein $$a_n = x(n) + x(n+2),$$

$$b_n = x(n+1),$$

and $$c_n = x(n+3) = x(n-1);$$

and
  x(n) is the sequence of sinal samples.

15. A device according to claim 12 for characterizing a DF signal comprising:
  (a) an analog to digital converter sampling use signal at a sampling frequency $v_s$ so as to obtain a sequence of signal samples;
  (b) a filter filtering the sequence of samples so as to produce a filtered sequence of signal samples; and
  (c) a computer processing unit processin the filter sequence of signal samples so as to produce an α-constant and a β-constant of the DF signal which minimizes an error function utilizing said sequence of signal samples.

16. A device for determining the two spectral components $v_1$ and $v_2$ of a DF signal comprising:
  (a) an analog to digital converter sampling the signal at a sampling frequency $v_s$ so as to obtain a sequence of signal samples;
  (b) a computer processing unit processing the sequence of signal samples so as to produce an α-constant and a β-constent of the DF signal which minimizes an error function utilizing said sequence of signal samples, the computer processing unit further processing and α-constant and the β-constant so as to calulate $v_1$ and $v_2$ from the α-constant and the β-constant using algorithmic expressions expressing $v_1$ and $v_2$ as functions of the α-consant and the β-constant.

17. A device according to claim 16 for determining the two spectral components $v_1$ and $v_2$ of a DF signal wherein $v_1$ and $v_2$ are calculated from the the α-constant and the β-constant using tbe algorithmic expressions:

$$v_1 = \frac{v_s}{2\pi}\cos^{-1}\lambda_1$$

$$v_2 = \frac{v_s}{2\pi}\cos^{-1}\lambda_2$$

wherein $$\lambda_1 = \frac{\alpha + \sqrt{\alpha^2 + 4(\beta+2)}}{4} \quad \text{and}$$

$$\lambda_2 = \frac{\alpha - \sqrt{\alpha^2 + 4(\beta+2)}}{4},$$

wherein α and β are the α-constant and the β-constant, respectively.

18. The device according to claim 16 for determining the two spectral components $v_1$ and $v_2$ of a DF signal wherein the computer processing unit performs the following additional steps:

(a) filtering the DF signal through the filter $W(z)=H(z\gamma_1)/H(z\gamma_2)$ so as to obtain a filtered DF signal, (b) obtaining the $\alpha$-constant and the $\beta$-constant of the filtered DF signal which minimizes an error function, (c) obtaining $v_1$ and $v_2$ according to the algorithmic expressions:

$$v_1 = \frac{v_s}{2\pi}\cos^{-1}\lambda_1$$

$$v_2 = \frac{v_s}{2\pi}\cos^{-1}\lambda_2$$

wherein $$\lambda_1 = \frac{\alpha + \sqrt{\alpha^2 + 4(\beta+2)}}{4} \text{ and}$$

$$\lambda_2 = \frac{\alpha - \sqrt{\alpha^2 + 4(\beta+2)}}{4},$$

wherein $\alpha$ and $\beta$ are of the filtered DF signal, (d) repeating steps a to c, as many times as desired. The method according to claim 1 wherein the signal is part of a telephone signal.

* * * * *